United States Patent
Schmitt

(10) Patent No.: US 7,158,403 B2
(45) Date of Patent: Jan. 2, 2007

(54) TERNARY BIT LINE SIGNALING

(75) Inventor: Peer Schmitt, Paris (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 10/791,834

(22) Filed: Mar. 4, 2004

(65) Prior Publication Data

US 2005/0195642 A1    Sep. 8, 2005

(51) Int. Cl.
*G11C 11/00* (2006.01)

(52) U.S. Cl. ...................................... 365/154

(58) Field of Classification Search ............... 365/154, 365/205, 189.03, 189.04
See application file for complete search history.

(56) References Cited

U.S. PATENT DOCUMENTS

| | | | | |
|---|---|---|---|---|
| 5,319,590 | A * | 6/1994 | Montoye ...................... | 365/49 |
| 5,995,419 | A * | 11/1999 | Trimberger ............ | 365/189.02 |
| 6,104,663 | A * | 8/2000 | Kablanian .............. | 365/230.05 |
| 6,188,594 | B1 * | 2/2001 | Ong .............................. | 365/49 |
| 6,266,263 | B1 * | 7/2001 | Lien et al. ..................... | 365/49 |
| 6,310,818 | B1 * | 10/2001 | Mukai .................... | 365/230.05 |
| 6,310,880 | B1 * | 10/2001 | Waller ......................... | 370/400 |
| 6,353,552 | B1 * | 3/2002 | Sample et al. .............. | 365/154 |
| 6,606,263 | B1 * | 8/2003 | Tang ............................ | 365/158 |
| 6,624,655 | B1 * | 9/2003 | Mandal et al. ................ | 326/30 |
| 6,804,143 | B1 * | 10/2004 | Hobson ...................... | 365/154 |

OTHER PUBLICATIONS

Hiroki Uchiyama et al., "Ternary Content Addressable Memory With Hamming Distance Search Functions", dated prior to filing of present application.

Igor Arsovski, et al., "A Ternary COntent-Addressable Memory (TCAM) Based on 4T Static Storage and Including a Current-Race Sensing Scheme", IEEE Journal of Solid-State Circuits, vol. 38, No. 1, Jan. 2003. pp. 155-158.

* cited by examiner

*Primary Examiner*—Thong Q. Le
(74) *Attorney, Agent, or Firm*—Banner & Witcoff, Ltd.

(57) ABSTRACT

A memory device is disclosed having a plurality of dual-bit addressable memory cells. In each memory cell, a first storage circuit for storing a first bit may be activated or de-activated depending upon the state of a second bit stored in a second storage circuit. The second bit may be considered to be a "don't care" bit, because depending upon the state of the second bit, the first bit may be irrelevant in that it cannot be read. Thus, each memory cell may effectively store three states: zero, one, and don't care.

9 Claims, 6 Drawing Sheets

TERNARY BIT LINE SIGNALING

FIELD OF THE INVENTION

Aspects of the present invention are directed generally to efficient triggering apparatuses and methods in an emulation system.

BACKGROUND

Emulation systems typically emulate circuit designs using one or more reconfigurable logic units. For example, an emulation system may have one or more field-programmable gate arrays (FPGAs) and/or processors that emulate the design. Each FPGA may include a plurality of reconfigurable logic elements. The reconfigurable logic units (e.g., FPGA chips, processors, and/or reconfigurable logic elements) may produce internal states and external outputs during running of the emulation.

During emulation, it is often desirable to be able to take some action as a result of a particular emulation event occurring. For example, a particular combination of internal states of reconfigurable logic elements may be an emulation event that is of interest. If the emulator achieves the emulation event of interest, then the emulator may be configured to take a specified action. This is called triggering.

Triggering can be based on a specified set or subset of the total internal states and/or external outputs. To provide for triggering capability based on internal states, the emulation system needs to have visibility into the internal states. In large emulation systems, there are Y*X reconfigurable logic elements (where Y is the number of reconfigurable logic chips and X is the number of reconfigurable logic elements per chip). Typically, to implement triggering, the internal states of a subset N of the reconfigurable logic elements are collected during emulation runtime. These are called trace bits. However, N is often several orders of magnitude larger than the total number of bits T that are actually part of and relevant to a trigger. Thus, T<<N. This is usually true not only at the system level, but also at the chip level. Because the remaining trace bits N−T that are collected are irrelevant to the outcome of the trigger, N−T of the N trace bits are also irrelevant to triggering.

To determine whether a trigger condition has occurred, the N trace bits are compared against pre-stored compare bits. If the comparison results in a match, then the trigger condition has occurred. However, such a comparison needs to take into account the fact that N−T of the trace bits (and N−T of the compare bits) do not affect the outcome of the comparison. Thus, a set of N "don't care" bits are also stored, each one indicating whether a related stored compare bit affects the outcome of the comparison. In other words, 2N bits (N compare bits and N don't care bits) are stored. These 2N bits are stored in memory such as a static random access memory (SRAM).

An SRAM-based trigger system uses mainly read power. Write power is mostly involved only at system initialization. In the above-described system, two bits are read out of the SRAM for each trace bit that is potentially part of the trigger. SRAMs are characterized by the amount of power required to read a single bit, plus miscellaneous power. For T useful compare bits, the useful power $P_{useful}$ is proportional to 2T. However, since 2N bits are actually read, the total power used by such a trigger system is proportional to 2N>>2T, and the total wasted/useless power $P_{waste}$ is proportional to 2(N−T)>>2T. Thus, $P_{waste}$ is proportional to $((N-T)/T)*P_{useful}$, and $P_{useful}$<<$P_{waste}$. Clearly, significant read power is wasted in such a triggering mechanism. This wasted power is multiplied many-fold when (as is often the case) trigger comparison is performed often, such as at least every clock cycle.

SUMMARY OF THE INVENTION

Aspects of the present invention are directed to improved triggering methods and apparatuses. The power and/or speed used to read stored trigger bits may be reduced dramatically using various aspects of the present invention.

Some aspects of the invention are directed to a memory device having a plurality of dual-bit addressable memory cells. In each memory cell, a first storage circuit for storing a first bit may be activated or de-activated depending upon the state of a second bit stored in a second storage circuit. The second bit may be considered to be a "don't care" bit, because depending upon the state of the second bit, the first bit may be irrelevant in that it cannot be read. Thus, each memory cell may effectively store three states: zero, one, and don't care. It is hence called a ternary memory cell.

According to further aspects of the present invention, such a ternary, dual-bit memory cell may be implemented in an extremely efficient manner. When the second bit is set such that the first bit is irrelevant, then very little to no energy is expended in connection with the first bit when reading the memory cell.

Still further aspects of the present invention involve using the inventive memory device in a tracing system of a logic emulation device. The memory device may store a string of compare bits in the first storage circuits with associated don't care bits in the second storage circuits. The tracing system may compare traced data from the logic emulation device with the compare bits.

These and other aspects of the invention will become apparent to one of ordinary skill in the art upon a reading of the following description, drawings, and the claims.

BRIEF DESCRIPTION OF THE DRAWINGS

The foregoing summary of the invention, as well as the following detailed description of illustrative embodiments, is better understood when read in conjunction with the accompanying drawings, which are included by way of example, and not by way of limitation with regard to the claimed invention.

DETAILED DESCRIPTION OF ILLUSTRATIVE EMBODIMENTS

Figure 1:
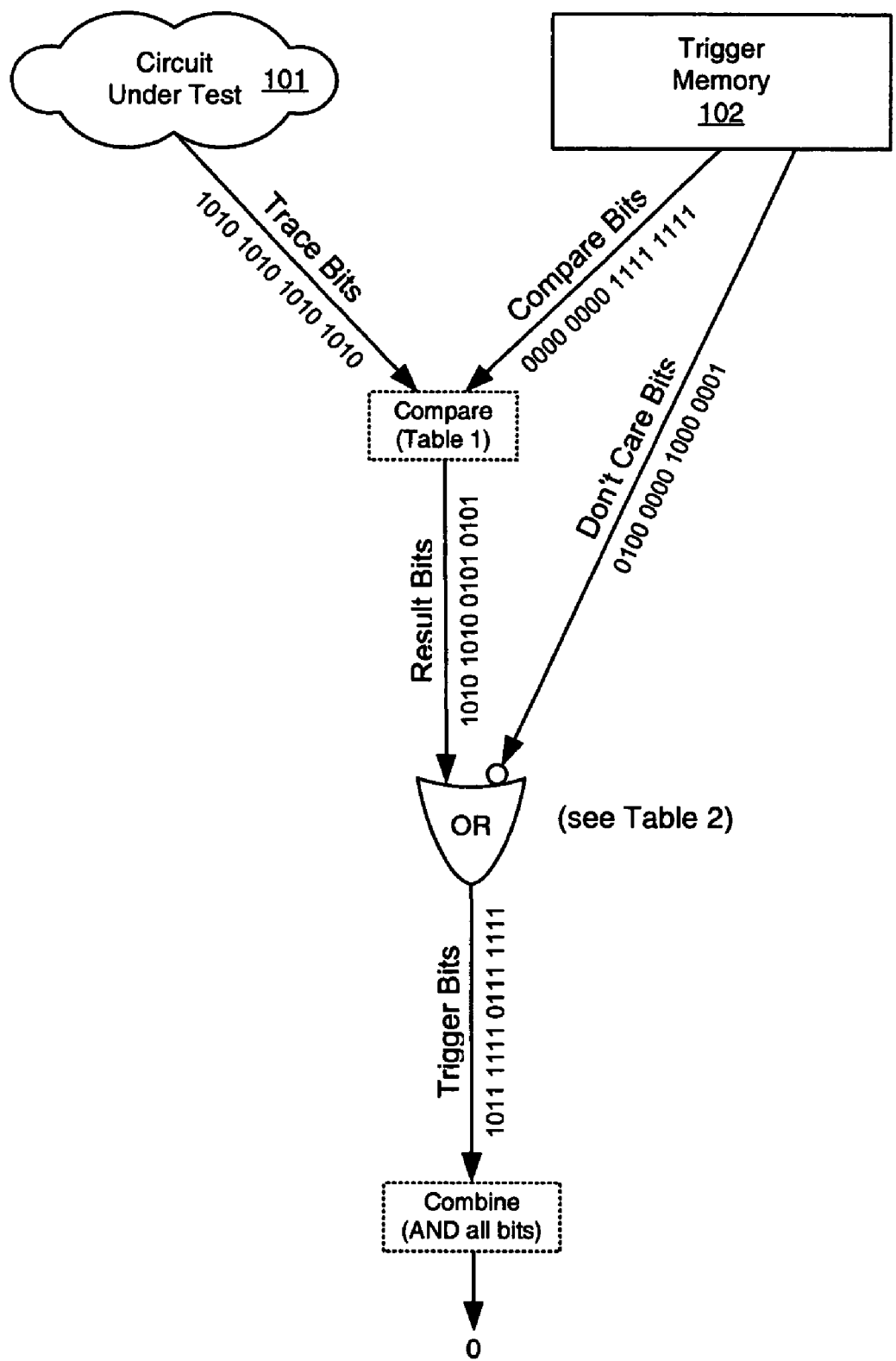
FIG. 1 shows the functional flow of how trigger detection may be performed when tracing state elements of a test circuit, in accordance with at least one aspect of the present invention.

Referring to FIG. 1, a set of trace bits including N trace bits may be extracted from a circuit under test 101. The circuit under test 101 may be in any form such as one or more integrated circuits and/or breadboards. The circuit under test 101 may be an emulator, such as a set of reconfigurable field-programmable gate arrays (FPGAs), a set of reconfigurable application-specific-integrated circuits (ASICs), or parallel processors, emulating a circuit design. Or, the circuit under test 101 may be a fixed non-reconfigurable circuit that does not emulate a design but is instead an embodiment of the design itself. The trace bits may be extracted from the circuit under test 101 in a number of ways, such as using scan chains in the circuit under test 101. The number N may be any number greater than or equal to one. In the illustrated example, there are N=16 trace bits of the binary values {0101 0101 0101 0101}. In the present printed text, spacing is provided between four-bit subsets. This arbitrarily-chosen spacing is provided only to assist the reader of this discussion in easily viewing the printed values of the bits, and has no other significance.

A set of compare bits $B_C$ (including at least N compare bits) may further be read from a "trigger" memory 102. The trigger memory 102 may be any memory such as a random-access memory (RAM) or a sequential-access memory. The trigger memory 102 may further be either static or dynamic, such as a static RAM (SRAM), a dynamic RAM (DRAM), a ferroelectric RAM (FRAM). In the illustrated example, there are N=16 compare bits of the binary values {0000 0000 1111 1111}.

In addition, a set of "don't care" bits $B_{DC}$ (including at least N don't care bits) may further be read from the trigger memory 102 or from another memory. In the illustrated example, there are N=16 don't care bits of the binary values {0100 0000 1000 0001}. Each don't care bit is associated with a respective different compare bit. In the present embodiment, a don't care bit set to zero means that the associated compare bit does not matter for triggering purposes (i.e., "don't care"). A don't care bit set to one means that the associated compare bit is used for triggering (i.e., "care"). For example, because the first don't care bit is set to zero, then it will not matter for triggering purposes what the first compare bit will be. On the other hand, because the second don't care bit is set to one, then (as will be discuss below), a comparison of an associated trace bit with that compare bit will affect triggering. In this particular example, only three of the sixteen don't care bits are set. Thus, out of the N=16 trace bits, only M=3 are relevant to triggering. Of course, the don't care bits could be reversed such that a don't care bit set to zero means that the compare bit is relevant and is used for triggering (i.e., "care"), and such that the don't care bit set to one means that the compare bit does not matter for triggering purposes (i.e., "don't care").

The N trace bits and the N compare bits may be compared on a bit-by-bit basis, resulting in N result bits. A comparison of each trace bit with a respective compare bit results in a respective result bit, indicating whether the trace and compare bits are the same as each other, as shown in Table 1. In the illustrated embodiment, there are N=16 result bits having the binary values {1010 1010 0101 0101}.

TABLE 1

| Trace Bit $B_T$ | Compare Bit $B_C$ | Result Bit $B_R$ |
|---|---|---|
| 0 | 0 | 1 |
| 0 | 1 | 0 |
| 1 | 0 | 0 |
| 1 | 1 | 1 |

The N result may then be combined with the N don't care bits in a bit-by-bit manner for each pair of bits in accordance with Table 2, to result in N trigger bits $B_T$. Where the don't care bit is set to "don't care" (e.g., zero), then the resulting trigger bit may be set to a default trigger bit value regardless of the value of the associated result bit. In the present example, the default trigger bit value is one (although it may alternatively be zero). In the illustrated embodiment, there are N=16 trigger bits having the binary values {1011 1111 0111 1111}.

TABLE 2

| Result Bit $B_R$ | Don't Care Bit $B_{DC}$ | Trigger Bit $B_T$ |
|---|---|---|
| 0 | 0 (don't care) | 1 |
| 0 | 1 (care) | 0 |
| 1 | 0 (don't care) | 1 |
| 1 | 1 (care) | 1 |

Finally, to determine whether a trigger state has occurred, the N trigger bits may be combined into a single trigger state bit, such as in the present example by logically ANDing them together. Thus, in the illustrated embodiment, since there is at least one trigger bit having a logical value {0}, a logical AND of the N=16 trigger bits results in a single trigger state bit {0}, meaning that a trigger state has not occurred. The N trigger bits may alternatively be combined in other ways, such as by logically ORing them together. A logical AND (or any other combining mechanism) may be implemented by one or more physical gates, such as by a series of complementary logic. The way that the N trigger bits are combined (e.g., by ANDing them or by ORing them) may determine the way that the don't care bits and/or the default trigger bit values are defined. For example, where the N trigger bits are to be ORed together, the default trigger bit value may be zero.

Because both the compare bits and the don't care bits are stored, a standard trigger memory would need to store at least 2N total bits of information. Each pair of a compare bit and an associated don't care bit make up a two-bit pair. However, there are really only three meaningful states that are defined by a pair of compare and don't care bits. One state is where $\{B_C, B_{DC}\}=\{00\}$ or $\{10\}$, which are each equivalent to each other as a don't care state (since the compare bit is irrelevant when the don't care bit is set). The second state is where $\{B_C, B_{DC}\}=\{01\}$, and the third state is where $\{B_C, B_{DC}\}=\{11\}$.

In a six-transistor (6T) SRAM, dual bit line access is used. One bit line represents a stored bit value and the other bit line represents its complement. This is also known as differential signaling or differential bit lines. Differential bit lines allow for a faster and more reliable SRAM. To speed operation and/or to prevent unintended overwriting of a memory cell, it may be desirable to pre-charge both bit lines to the same or similar intermediate potentials prior to connecting the bit lines to a memory cell. There are several functional benefits in doing so, such as being able to provide more compact bit cells with minimal size PMOS devices.

Assume the probability of a stored compare bit being zero, p(0), is equal to the probability of a stored compare bit being one, p(1). Also assume the probability of a stored compare bit not being part of the trigger is nearly unity (i.e., p(don't care)~1). Then, if two 6T SRAM cells are used to store a compare bit and its companion don't care bit, it may be preferable to pre-charge the bit-lines of the cell storing the don't care bit, not to an intermediate value, but instead to the most likely differential value: "don't care." However, depending upon the SRAM, there may be a timing issue when reading a "care" value, since the bit cell has to invert the bit lines. Most 6T cells will have problems charging one of the bit lines, while discharging is a normal process. They may even not be able to do so, since applying a differential voltage is the common write process. Depending on the parasitic capacitance of the bit line (which may be affected by manufacturing process, length, and bit cell load and leakage), this alternative may have functional/performance limitations.

Using this approach, the bit cell that stores the compare bit would always be pre charged. The "don't care" bit cell would draw current only when it inverts the bit lines. The average current consumed can be assumed to be nearly zero when averaged over numerous evaluation cycles, since p(don't care)~1. Let Cbl be the characteristic bit line capacitance, V the core voltage, and F the read frequency. The capacitive charge/discharge power associated with a single dual bit line read access, where both bit lines are pre charged to the same level V, would be Pbit=Cbl*$V^2$*F∝Cbl. Where two bit cells are accessed per evaluation cycle, the total power would be proportional to 2*Cbl. In the case described here, where don't care bits use an optimized pre-charge, their power contribution is further reduced such that the power consumption becomes proportional to Cbl (only one dual access).

A 5T SRAM cell, characterized by a unique bit-line with an equivalent capacitance Cbl, will also work as in the approach just described here. The power of the bit cell coding for the compare bit would depend on the compare bit value itself (using single bit line access). If p(1)=p(0)=0.5, and bit line=1 means "don't care," then the total pre-charge power is proportional to Cbl*p(0)=Cbl/2. Since 5T cells have lower reliability, especially for read access, they may not be the best candidates in deep sub-micron SRAMs.

In addition, word line related power is of a similar magnitude as bit line related power. Since word lines typically run over a whole memory array, the power associated with word lines is proportional to the amount of bits that must be read. The absolute value depends on the signaling strategy (e.g., full swing versus half swing). Word line power is a large contributor in miscellaneous power.

Specialized Dual-Bit Memory Cells

Figure 2:
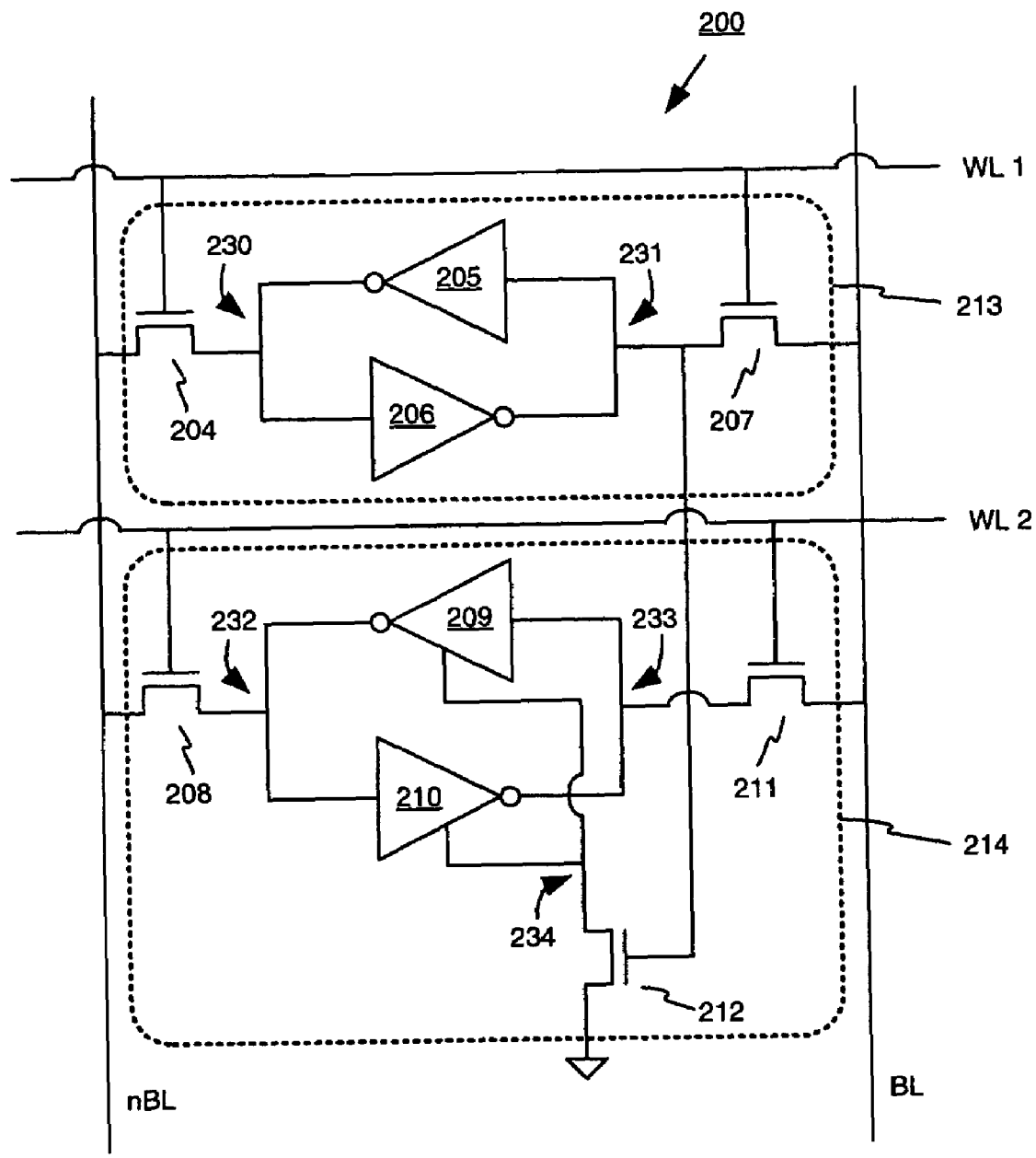
FIG. 2 is a schematic diagram of an illustrative dual-bit memory cell in accordance with at least one aspect of the present invention.

As previously discussed, with a pair made up of a compare bit and a don't care bit, three meaningful states exist: compare value=0, compare value=1, and compare value=don't care. Referring to FIG. 2, an illustrative dual-bit memory cell 200 is shown that addresses this coding need while allowing one of the codes (don't care) to be particularly power efficient. The trigger memory 102 may have an array or other grouping of such dual-bit memory cells 200, including at least N dual-bit memory cells 200.

Each dual-bit memory cell 200 as shown has a pair of storage circuits: a "don't care" storage circuit 213 and a "compare" storage circuit 214. Each of the storage circuits 213, 214 stores one bit of information. The don't care storage circuit 213 has a pair of inverters 205, 206 that together form a latch. The don't care storage circuit 213 may be a write-only storage circuit, however it may configured to be readable for testing purposes. As shown, the don't care storage circuit 213 is a six-transistor (6T) circuit. However, the don't care storage circuit 213 may instead be a 5T storage circuit by removing transistor 207. The state of that latch at nodes 230 and 231 represent a don't care bit. The compare storage circuit 214 has a pair of inverters 209, 210 that together form a latch, and the state of that latch at nodes 232 and 233 represents an associated compare bit. As shown, the compare storage circuit 214 is a seven-transistor (7T) circuit (6T for storage and 1T for control by the don't care storage circuit 213). The storage circuits 213, 214 may store bits in a number of ways and are not limited to the use of latches.

Each of the inverters 209, 210 may be a pseudo tri-state inverter and has an output enable, coupled to an output enable node 234 (which is driven by the state of node 231), that determines whether the inverter is able to invert a logical one. In this embodiment, when the output enable node 234 is floating (and thus node 231 is low), then the outputs of the inverters 209, 210 have a high impedance in response to a high input and a low impedance high output in response to a low input. Output-enabled inverters in general are known in the art. The present inverter is called pseudo tri-state because its output impedance is low and the driven value is high in response to a low input regardless of the enable signal.

The inverters 209, 210 (and thus the compare storage circuit 214) are enabled and disabled based on the don't care bit stored in the don't care storage circuit 214 at node 231. To do this in the present embodiment, the compare storage circuit 214 has a transistor 212 that receives as a control signal the state of the latch 205, 206 at node 231 in the don't care storage circuit 213. When the node 231 is high (and thus node 230 is low), then the transistor 212 is turned on and connects the output enable node 234 to a fixed potential such as ground. When the node 231 is low (and thus node 230 is high), then the transistor 212 is turned off and disconnects the output enable node 234 from the fixed potential.

Each of the storage circuits 213, 214 also may have one or more transistors 204, 207, 208, and/or 211 that selectively allow the states of nodes 230, 231, 232, and/or 233, respectively, to pass to bit lines. Each storage circuit 213, 214 is coupled to a pair of differential bit lines BL and nBL. The don't care storage circuit 213 is coupled to a first word line WL1, and the compare storage circuit 214 is coupled to a second word line WL2.

In operation, the trigger memory 102 is programmed with the compare bits and the don't care bits. During emulation, comparisons are made between the trace bits and the stored compare bits. However, the don't care bits do not need to be read. Where a don't care bit is set to zero, node 231 is low and transistor 212 is turned off. Thus, node 234 is disconnected from ground and the inverters 209 and 210 are output disabled in response to high inputs. Accordingly, when the compare storage circuit 214 is read, differential bit lines BL and nBL will remain precharged and the {1, 1} combination can be interpreted as a non relevant data for the trigger.

On the other hand, when the don't care bit is set to one, node 231 is high and transistor 212 is turned on. Thus, node 234 is connected to ground and the inverters 209 and 210 are output enabled. Accordingly, when the compare storage circuit 214 is read, differential bit lines BL and nBL will be either {1, 0} or {0, 1). These differential values can be interpreted as a logical 1 and a logical 0 respectively.

In either case, only the compare storage circuit 214 is read. Thus only half of the normally required reads are implemented during run time. The power behavior of this memory is obtained by evaluating decoding power and parasitic power. Assuming that the bit cell array area is similar to conventional SRAM trigger memories (since the number of total bit cells is unchanged), word line related power (which accounts for a large portion of the decoding power) is cut in half.

Although the trigger memory 102 may have any of a variety of configurations, in one particular embodiment the trigger memory 102 is wide and shallow, meaning that it has a relatively large number of short bit lines. Assuming that the basic trigger evaluation memory block is 128 bits wide and 32 bits deep, the proposed power oriented design will be equivalent when 64 bits wide and 64 bits deep. As a first approximation, since the bit cells are rearranged but the total number does not change, the proposed block has two times less bit lines which are two times longer, so the total amount of bit lines to be pre-charged per access is unchanged.

With 64 bit wide words (for example), up to a maximum of 64 potential bit lines would need to be pre charged, depending upon how the don't care bits $B_{DC}$ are set (only one bit line per pair would be discharged for differential signaling). Then, $64*C_{route}*L$ is the characteristic bit line capacitance Cbl to be used for power comparison between a conventional SRAM and the power optimized block, where $C_{route}$ is the capacitance per unit length of each bit line and L is the length of each bit line. The bit line related power consumption Pbl for a conventional SRAM would be proportional to Cbl. Assuming that the word lines have a similar length and operate in accordance with full swing logic, an additional Pbl amount of power would be consumed, bringing the total power for net switching to 2Pbl.

In the above-described illustrative block, taking advantage of the assumption that p(don't care)~1 means that there is almost no bit line related power being consumed. Word line related power Pwl is cut in half, such that the total power for net switching in the above example would be only Pwl=Pbl/2, which is a four-fold reduction in total switching power consumed. Pwl is cut in half because there are twice as many word lines but they are only half as long. Thus, although there is a similar amount of net capacitance to switch as in a standard SRAM, only every other word line needs to be read.

In standard shallow SRAMs, the relative silicon area used for the sense amplifiers is often important, followed by the silicon area used for decoding logic. Some gain in silicon area may be achieved because only half of the original sense amplifiers may be needed, but as a first approximation, we can assume the global block size is the same.

In deep sub-micron processes, the parasitic lateral capacitance may now be in the range of approximately 80% of the total capacitance, using reduced width metal runs and reduced spacing. Because memory arrays may be manufactured with high features density, the power required for the switching of parasitic capacitors is mainly due to "same layer" routing. Low swing techniques may be used to allow the word lines to be driven with less power. Internally-timed techniques may further be used to allow unnecessary bit line discharges to be avoided once a compare bit has been evaluated. However, these techniques use additional circuit area that may be undesirable unless the trigger memory 102 is large. For a smaller trigger memory 102, keeping circuitry simple may allow small silicon areas per bit to be achieved. Decoders and sense amplifiers may be expected to roughly the same order of magnitude of area as memory cells would where the trigger memory 102 is in the range of only a few hundreds bits.

Sense Amplifier/Differential Bit Line Evaluation

Figure 3:
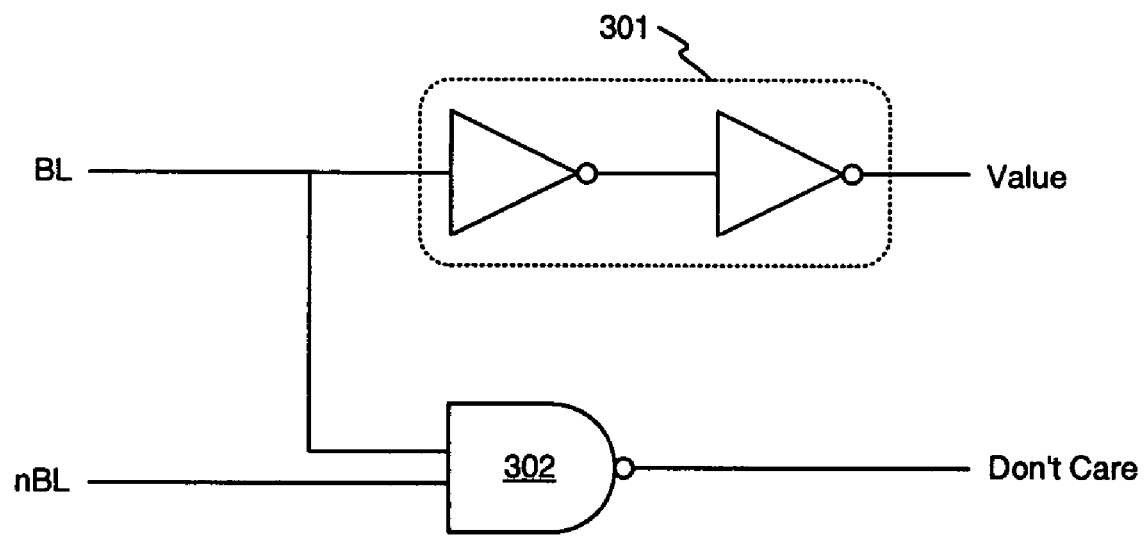
FIG. 3 is a schematic diagram of an illustrative sense amplifier in accordance with at least one aspect of the present invention.

When reading one of the dual bit memory cells 200, the values of the bit lines BL and nBL are sensed. Referring to FIG. 3, where the bit lines are short, a simple buffer such as a double inverter 301 may be used as a non-differential sense amplifier on BL, and a NAND gate 302 may receive BL and nBL as its inputs. The output of the double inverter 301 provides the compare bit value, and the output of the NAND gate 302 indicates whether a don't care state exists. The evaluator circuit of FIG. 3 may be separate from or embedded in the trigger memory 102.

Figure 4:
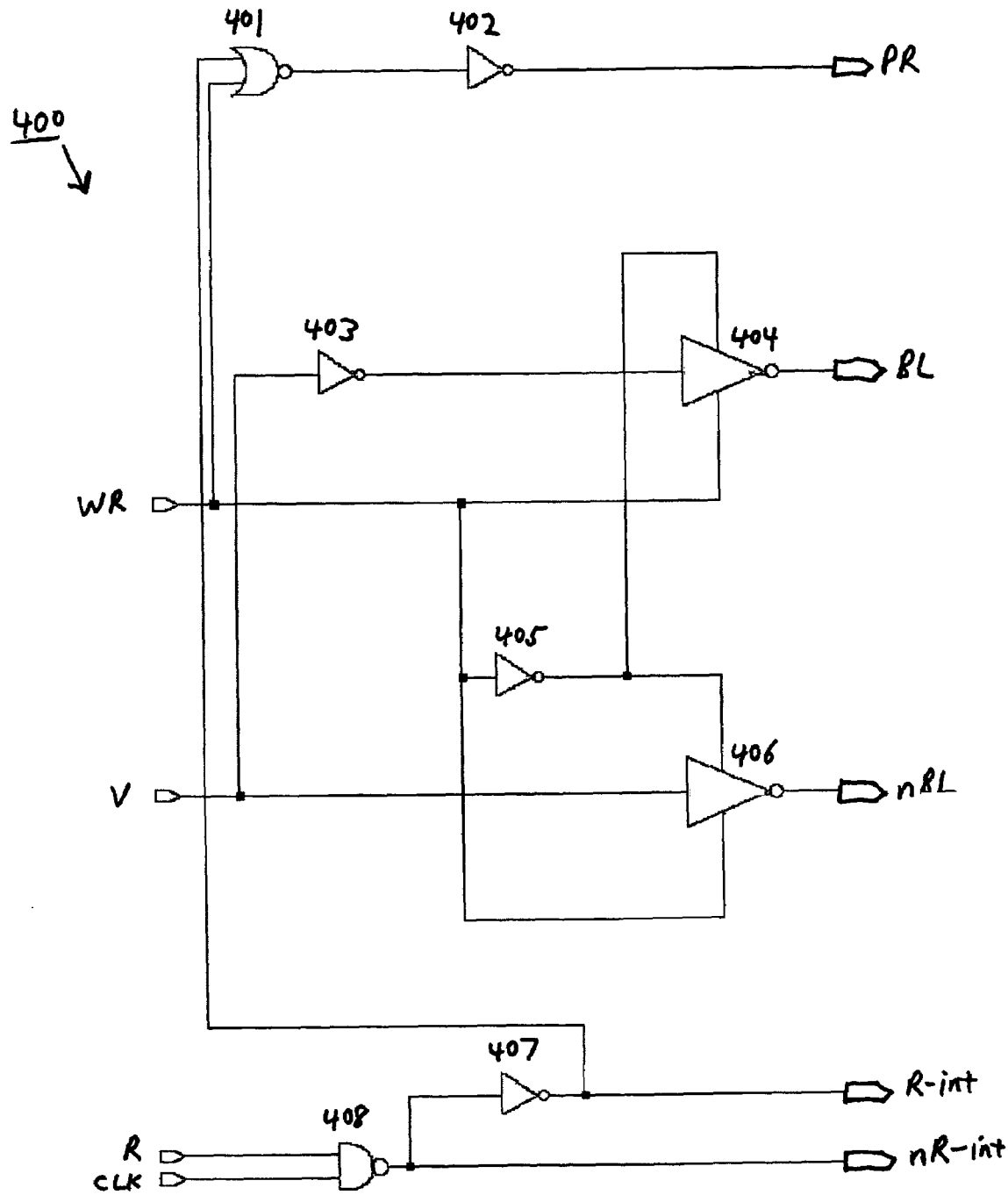
FIG. 4 is a schematic diagram of a control portion of a more complex illustrative sense amplifier in accordance with at least one aspect of the present invention.
Figure 5:
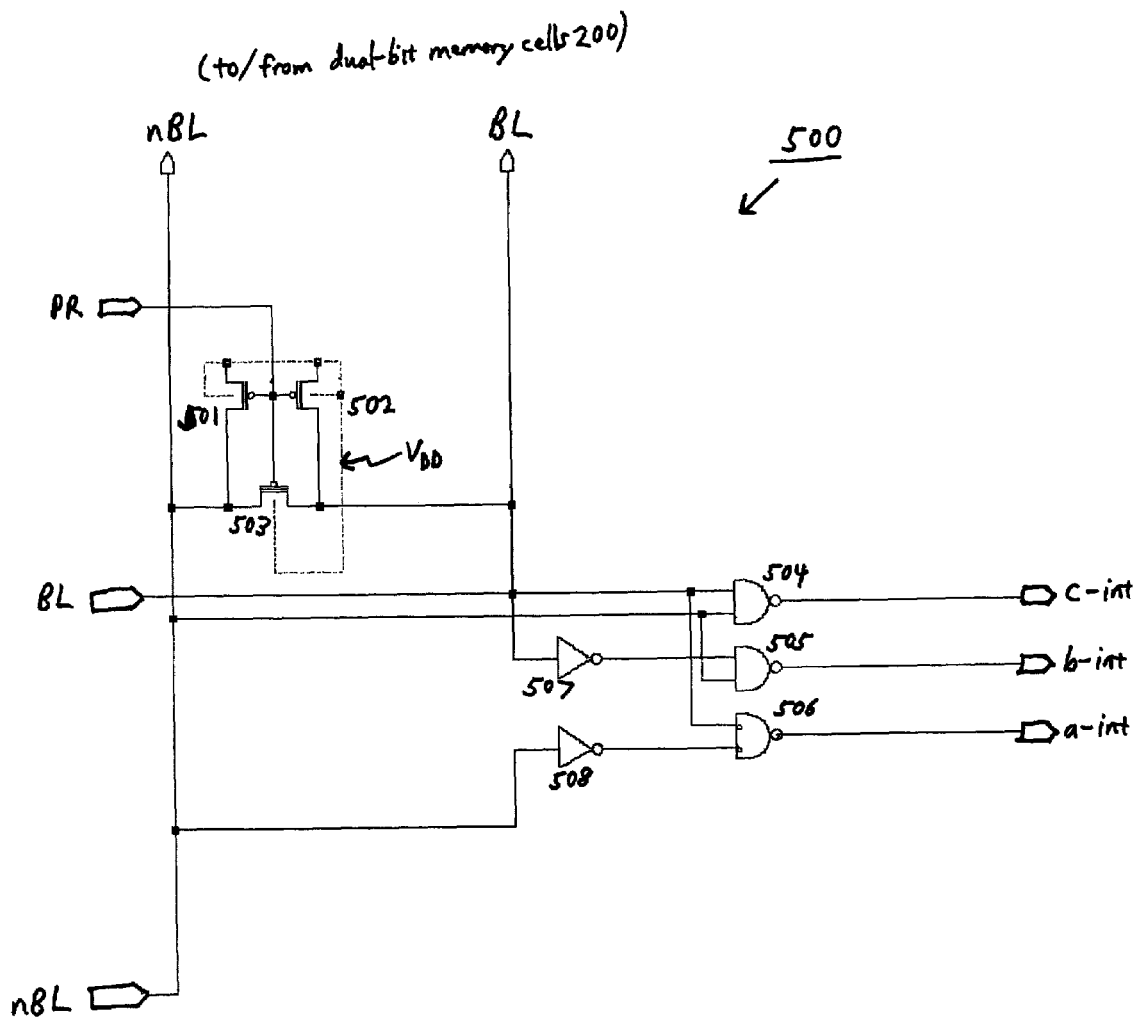
FIG. 5 is a schematic diagram of an evaluation portion of the same sense amplifier as in FIG. 4.
Figure 6:
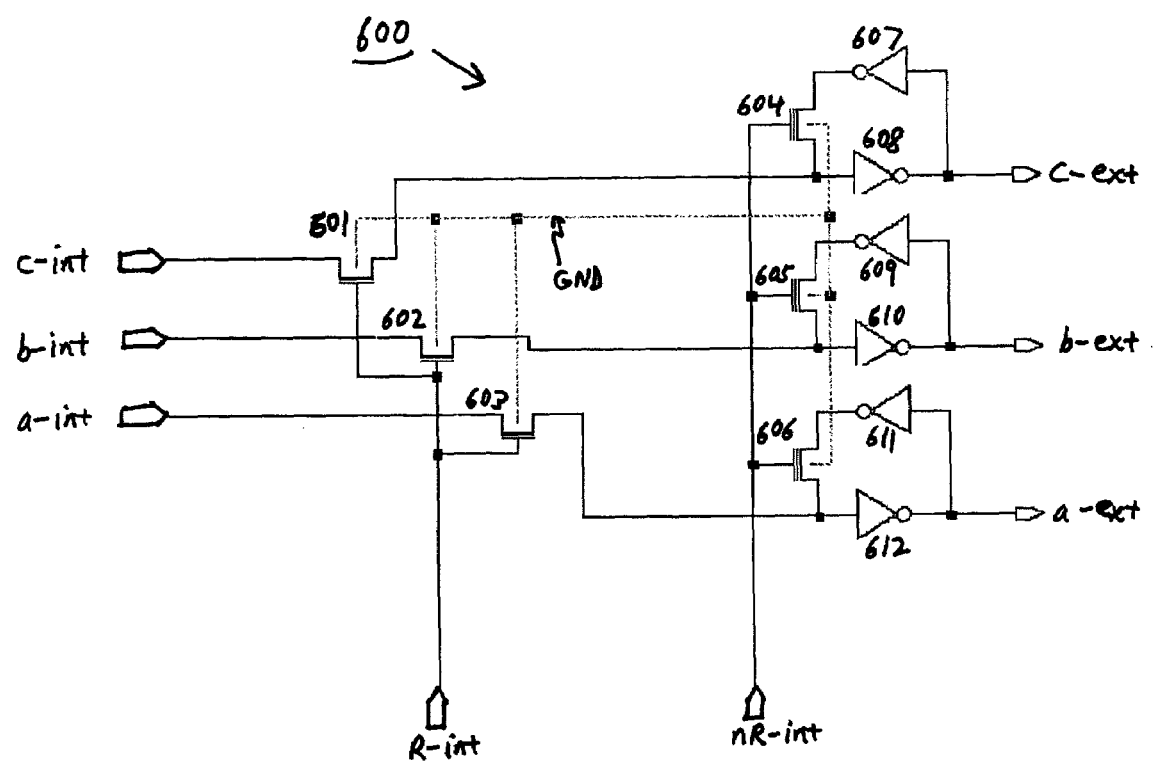
FIG. 6 is a schematic diagram of a drive portion of the same sense amplifier as in FIG. 4.

An illustrative specialized sense amplifier, shown in FIGS. 4, 5, and 6, collectively, writes values to the dual-bit memory cell 200, and additionally reads ternary information from the dual-bit memory cell 200, on the pair of bit lines BL, nBL. The sense amplifier includes a control portion 400 (FIG. 4), an evaluation portion 500 (FIG. 5), and a drive portion 600 (FIG. 6). The sense amplifier as illustrated uses clock synchronous circuitry to generate internal pre-charge commands on one-half of a clock cycle. This same time frame may be used for address decoding in a full circuit, since this is also a good time frame for refreshing the bit lines.

Referring to FIG. 4, the control portion 400 of the illustrative sense amplifier includes a NOR gate 401, inverters 402–407, and NAND gate 408. Inverters 404 and 406 are tri-state inverters. The control portion 400 receives a write command signal WR (active high in this embodiment), write value V, a read command signal R (active high in this embodiment), and a clock signal CLK. For writing, pre-charging is not necessary, and so signal WR does not need to be synchronized internally with CLK. A high WR enables, and a low WR disables, tri-state inverters 404 and 406, which pass the write value V to the bit line BL, and inverted V to the inverted bit line nBL. For reading, signal R is gated with signal CLK (or other signal with an appropriate duty cycle) using NAND gate 408 to produce synchronized read command signal R-int and inverted synchronized read command signal nR-int. Signals WR and R-int are logically OR'ed together by gates 401 and 402 to produce a pre-charge signal PR, which controls pre-charging. As will be seen in FIG. 5, pre-charging is disabled (PR is high) when the read signal R or write signal W is active.

Referring to FIG. 5, the evaluation portion 500 of the illustrative sense amplifier receives signal PR from the control portion 400. The evaluation portion 500 also receives BL and BLn from either the control portion 400 (during a write cycle) or externally from a dual-bit memory cell 200 (during a write cycle). The evaluation portion 500 includes PMOS transistors 501, 502, and 503 (which make up a pre-charge circuit), inverters 507 and 508, and NAND gates 504–506. The pre-charge circuit is fed pre-charge voltage $V_{DD}$ and is controlled by pre-charge signal PR. When PR is high in this embodiment (i.e., either a read or write command is occurring), the pre-charge circuit is disabled and pre-charging is also disabled. However, when PR is low (i.e., no read or write command), then pre-charging is enabled by shorting BL and nBL across transistor 503 and connecting them to $V_{DD}$ across transistors 501 and 502, thereby pre-charging BL and nBL.

During a write operation, the values of BL and nBL are provided externally to a dual-bit memory cell 200. During a read operation, the evaluation portion 500 decodes BL and nBL into inverted one-hot code as shown in Table 3. The inverted one-hot code is merely illustrative; any type of coding may be used. The position of the zero indicates the state. If the zero is located at a-int, then the compare value is zero. If the zero is located at b-int, then the compare value is one. If the zero is located at c-int, then the compare value does not matter (don't care state). Decoding is also performed in this embodiment during a write, but the decoded information is neither used nor needed by the drive portion 600, and so extra logic for disabling decoding during write is not necessary and would consume wasted silicon area. Decoding in the evaluation portion 500, using inverters 507 and 508, and NAND gates 504–506, is CMOS-based, as opposed to typical sense amplifiers. This is possible and desirable because of the very short bit lines that may be used, which allow faster switching of inverters 507 and 508. The evaluation portion 500 outputs decoded signals a-int, b-int, and c-int to the drive portion 600.

TABLE 3

| BL | nBL | a-int | b-int | c-int | State |
|----|-----|-------|-------|-------|-------|
| 0  | 1   | 0     | 1     | 1     | value = 0 |
| 1  | 0   | 1     | 0     | 1     | value = 1 |
| 1  | 1   | 1     | 1     | 0     | Don't Care |

Referring to FIG. 6, the drive portion 600 of the sense amplifier has a plurality of transistors 601–606, as well as a plurality of inverters 607–612. Each signal a-int, b-int, and c-int received from the evaluation portion 500 is input into a different latch. In particular, signal a-int is input into a latch made up of transistors 601 and 604, and inverters 607 and 608, which outputs signal a-ext. Signal b-int is input into a latch made up of transistors 602 and 605, and inverters 609 and 610, which outputs signal b-ext. Signal c-int is input into a latch made up of transistors 603 and 606, and inverters 611 and 612, which outputs signal c-ext. The drive portion 600 also receives as inputs clocked read signals R-int and nR-int from the control portion 400. When R-int is high in the first half of a read cycle, then transistors 601–603 are active, allowing their respective input signals a-int, b-int, and c-int to pass through. When CLK causes nR-int to become high (and R-int changes to low) in the second half of the read cycle, transistors 604–606 become active, thereby enabling their respective latch portions made up of the inverters 607–612. The signals a-int, b-int, and c-int are thus latched and held in the second half of the read cycle and provided as signals a-ext, b-ext, and c-ext, respectively. Depending upon the application (e.g., trace, trigger, etc.), several columns of dual-bit memory cells 200 may be combined (such as with large OR gates), and the combined result may be latched into a single driving circuit.

CONCLUSION

Thus, improved methods and apparatuses for implementing various comparison functionality in an emulator, such as trigger functionality, have been disclosed. Also disclosed have been improved methods and apparatuses for storing ternary information and for reading and writing ternary information. By implementing one or more aspects of the present invention, an emulation system may see improved speed and reduced power consumption.

While apparatuses and methods as described herein embodying various aspects of the present invention are shown by way of example, it will be understood that the invention is not limited to these particular embodiments. Modifications may be made by those skilled in the art, particularly in light of the foregoing teachings. For example, one or more of the elements of the aforementioned embodiments may be utilized alone or in combination with one or more elements of the other embodiments. In addition, the invention has been defined using the appended claims, however these claims are also illustrative in that the invention conceived of includes elements and steps described herein in any combination or sub combination. It will also be appreciated and understood that modifications may be made without departing from the true spirit and scope of the invention. For example, bits set to ones and zeros may be reversed, and alternative logic circuits may be used to implement the various storage, sensing, comparison, and other features of the invention.

What is claimed is:

1. A memory device, comprising:
   a plurality of addressable memory cells, each memory cell configured to store a first bit and a second bit, each memory cell including:
      a first storage circuit configured to store the first bit; and
      a second storage circuit configured to store the second bit and coupled to the first storage circuit, and further configured to deactivate the first storage circuit based on the second bit.

2. The memory device of claim 1, further including a first bit line coupled to at least one of the memory cells,
   wherein the first storage circuit of the at least one memory cell includes:
      an enable node and a first output node, wherein the first storage circuit has either a high or low impedance at the first output node depending upon a logical value of the enable node, the first bit line selectively receiving a logical value of the first output node,
   and wherein the second storage circuit of the at least one memory cell includes:
      a second output node configured to control the enable node, the first bit line selectively receiving a logical value of the second output node.

3. The memory device of claim 2, further including a second bit line coupled to the at least one memory cell,
   wherein the first storage circuit of the at least one memory cell includes:
      a third output node, wherein the first storage circuit has either a high or low impedance at the third output node depending upon a logical value of the enable node, the third output node having a logic value opposite the first output node when the first storage circuit has a low impedance at the first and third output nodes, the second bit line selectively receiving a logical value of the third output node,
   and wherein the second storage circuit of the at least one memory cell includes:
      a fourth output node having a value opposite the second output node, the second bit line selectively receiving a logical value of the fourth output node.

4. The memory device of claim 1, wherein each first storage circuit includes:
   a first inverter having an input, an output, and an output enable;
   a second inverter having an input, an output, and an output enable, the first and second inverters forming a first latch; and a first transistor having a source and drain coupled between the output enables of the first and second inverters and a fixed potential, and a gate coupled to the second storage circuit.

5. The memory device of claim 4, wherein each second storage circuit includes a second latch, the gate of the first transistor being coupled to a node of the second latch, a bit line selectively receiving a logical value of the node.

6. An apparatus, comprising:
  a plurality of dual-bit memory cells, each memory cell including:
    a first storage circuit configured to store a first bit, and
    a second storage circuit configured to store a second bit;
  a first plurality of word lines each controlling one of the first storage circuits; and
  a second plurality of word lines each controlling one of the second storage circuits,
  wherein the first storage circuit includes a transistor having a gate, the gate coupled to the second storage circuit so as to receive a value of the second bit.

7. The apparatus of claim 6, wherein the first storage circuit includes a flip flop that stores the first bit and that has a control node, the transistor further coupled between the control node and a fixed potential.

8. The apparatus of claim 6, wherein the second storage circuit includes a flip flop that stores the second bit at a storage node, the gate of the transistor being coupled to the storage node.

9. The apparatus of claim 6, further including a bit line pair each coupled to one of the memory cells, each bit line pair coupled to logic that combines the respective bit line pair into a single logical value.

* * * * *